United States Patent
Hsu

(10) Patent No.: US 9,226,425 B2
(45) Date of Patent: Dec. 29, 2015

(54) RACK AND CHASSIS THEREOF

(71) Applicant: Inventec (Pudong) Technology Corporation, Shanghai (CN)

(72) Inventor: Yung-Chin Hsu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 412 days.

(21) Appl. No.: 13/844,876

(22) Filed: Mar. 16, 2013

(65) Prior Publication Data
US 2014/0116970 A1 May 1, 2014

(30) Foreign Application Priority Data
Oct. 31, 2012 (CN) .......................... 2012 1 0428268

(51) Int. Cl.
*H05K 7/18* (2006.01)
*H05K 7/14* (2006.01)

(52) U.S. Cl.
CPC ................ *H05K 7/18* (2013.01); *H05K 7/1488* (2013.01)

(58) Field of Classification Search
CPC . H05K 7/1401; H05K 7/1409; H05K 7/1411; H05K 7/1485; H05K 7/1488; H05K 7/1489; H05K 7/18; G11B 33/127
USPC ......................................... 211/26; 312/223.2
See application file for complete search history.

(56) References Cited

U.S. PATENT DOCUMENTS

| | | | |
|---|---|---|---|
| 5,868,261 A * | 2/1999 | Collins et al. .................... 211/26 |
| 6,052,278 A * | 4/2000 | Tanzer et al. ............ 361/679.33 |
| 6,512,679 B1 * | 1/2003 | Shearman et al. ............ 361/759 |
| 6,648,149 B2 * | 11/2003 | Robertson ....................... 211/26 |
| 6,952,341 B2 * | 10/2005 | Hidaka et al. ............ 361/679.32 |
| 7,012,808 B2 * | 3/2006 | Mayer ........................... 361/725 |
| 7,137,512 B2 * | 11/2006 | Nguyen et al. .................. 211/26 |
| 7,318,532 B1 * | 1/2008 | Lee et al. ......................... 211/26 |
| 7,408,772 B2 * | 8/2008 | Grady et al. ............ 361/679.48 |
| 7,511,953 B2 * | 3/2009 | Tao et al. ................. 361/679.39 |
| 8,096,627 B2 * | 1/2012 | Lin ................ 312/325 |
| 8,727,138 B2 * | 5/2014 | Dittus et al. ..................... 211/26 |
| 2003/0160010 A1 * | 8/2003 | Robertson ....................... 211/26 |
| 2005/0238421 A1 * | 10/2005 | Doerr et al. ............... 403/322.4 |
| 2005/0254210 A1 * | 11/2005 | Grady et al. .................. 361/695 |
| 2006/0274508 A1 * | 12/2006 | LaRiviere et al. ............ 361/727 |
| 2009/0058236 A1 * | 3/2009 | Lin ............................ 312/223.2 |
| 2009/0086456 A1 * | 4/2009 | Milo et al. ..................... 361/801 |
| 2009/0224640 A1 * | 9/2009 | Yang et al. ................. 312/223.2 |
| 2011/0279973 A1 * | 11/2011 | Terwilliger et al. ...... 361/679.58 |
| 2014/0084764 A1 * | 3/2014 | Doglio et al. ............. 312/223.2 |

* cited by examiner

*Primary Examiner* — Patrick Hawn
(74) *Attorney, Agent, or Firm* — Locke Lord LLP; Tim Tingkang Xia, Esq.

(57) ABSTRACT

A rack includes a frame rack and a chassis, for hosting a server. The frame rack has a fixing part. The chassis includes a shelf disposed detachably on the frame rack, a fastening element and a guide member. The shelf has a guiding groove and a first fastening portion. The fastening element has a fastening end and a pivot end fastened to the shelf allowing the fastening end to move pivotally at a release position and fastening position. The guide member is connected to the midsection of the fastening element and slideable in the guiding groove. The guide member is drawn off the guiding groove when the fastening element turns pivotally to its release position. When the fastening element rotates to the fastening position, the fastening end of the fastening element clasps with the first fastening portion, whereas the pivot end clasps with the fixing part.

7 Claims, 4 Drawing Sheets

RACK AND CHASSIS THEREOF

CROSS-REFERENCE TO RELATED APPLICATIONS

This non-provisional application claims priority under 35 U.S.C. §119(a) on Patent Application No(s). 201210428268.6 filed in China, P.R.C. on Oct. 31, 2012, the entire contents of which are hereby incorporated by reference.

BACKGROUND OF THE INVENTION

1. Technical Field of the Invention

The disclosure relates to a rack, and more particularly to a rack with chassis.

2. Description of the Related Art

With the constant development in the modern technology, the society has entered the era of the internet and our daily lives increasingly depend on the use of network. As the number of internet users increases continuously, demands in constructing the hardware for operating internet rises. Therefore, servers used for establishing internet now play an important role in the world of internet.

Currently, the application of the server not only has combined internet and telecommunication, but also has emerged in finance, investment, online banking and online credit cards. All these applications heavily rely on servers for vast computing power and unbreakable protection of confidential information. Through the area of local network, internet or other networks, servers are used to process and store information. In addition, server is used to distribute needed data and information to other digital data processing device in a client server network environment.

The conventional tower servers are bulk in space. Hence, when a plurality of servers are employed in the enterprises, the amount of space required by the servers is an issue. In recent years, the rack-mount system has been developed and became the mainstream in the system configuration, storage, and installation of a server. In the rack-mount system, each server has its central processing units, a set of chips, memory and hard disks. Thereby, each server is able to operate independently. The size of the motherboard of the server is reduced considerably. Servers are stacked on each other in a rack formed and can be freely selected and detached.

For avoiding the server being in bad contact with the power supply and control module, or loosely slipping out of the rack, a chassis is designed to hosts the server inside the rack when the server is placed in the rack. Features in the design of the chassis, meanwhile, should allow users to place the server on the rack or remove the server from the rack easily. Therefore, to design a rack that allows moving the servers in and out with ease has become a challenge to engineers and technical designers nowadays.

BRIEF DESCRIPTION OF THE DRAWINGS

The disclosure will become more fully understood from the detailed description given herein below for illustration only, and thus does not limit the present disclosure, wherein.

SUMMARY OF THE INVENTION

Figure 1:
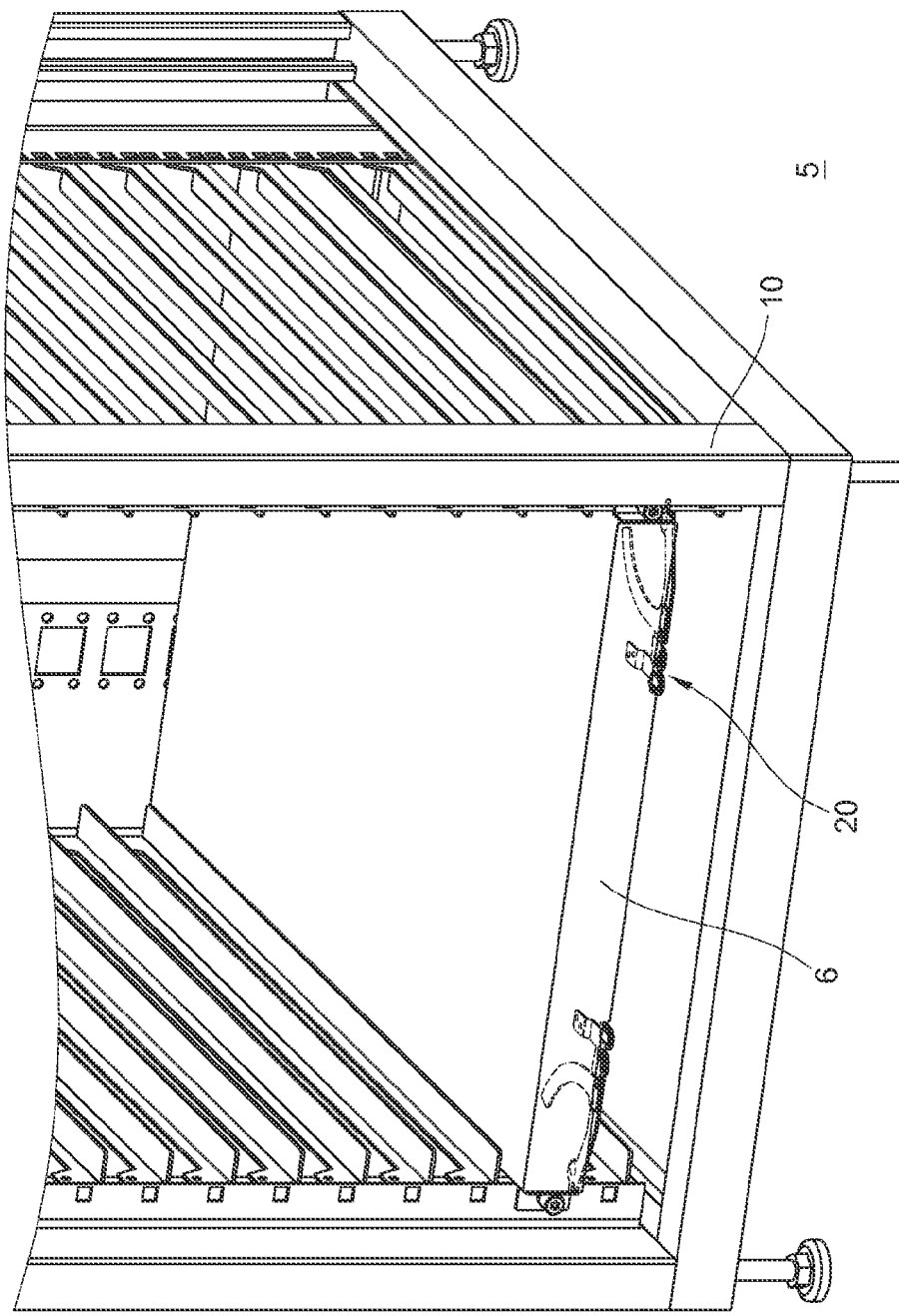
FIG. 1 is a perspective partial view of the rack according to an embodiment of the disclosure.

In one embodiment, the disclosure provides a rack for hosting a server. The rack comprises a frame rack and a chassis. The chassis comprises a shelf, a fastening element and a guide member. The shelf is disposed detachably on the frame rack. The shelf hosts the server and has a guiding groove as well as a first fastening portion. The fastening element has a fastening end and a pivot end. The pivot end is pivotally connected to the shelf allowing the fastening end to turn pivotally away from the first fastening portion or to clasp with the first fastening portion at a release position or fastening position respectively. The guide member is configured to slide in the guiding groove. One end of the guide member is connected to the midsection of the fastening element. The guide member is driven by the fastening element to be away from the guiding groove when the fastening element moves pivotally from the fastening position to the release position. Thereby, the fastening element is guided to cause the fastening end of the fastening element to clasp with the first fastening portion of the shelf, and cause the pivot end of the fastening element to clasp with the fixing part of the frame rack when the fastening element moves pivotally from the release position to the fastening position.

In another embodiment, the disclosure provides a chassis disposed detachably on the frame rack. The frame rack has a fixing part. The chassis comprises a shelf, a fastening element, and a guide member. A shelf is disposed detachably on the frame rack. The shelf is configured for hosting the server. The shelf has a guiding groove and a first fastening portion. A fastening element has a fastening end and a pivot end. The pivot end is fastened to the shelf allowing the fastening end to turn pivotally away from the fastening portion or to clasp with the fastening portion at a release position or fastening position respectively. A guide member is configured to slide in the guiding groove. One end of the guide member is connected to the midsection of the fastening element. When the fastening element moves pivotally from the fastening position to the release position, the guide member is driven by the fastening element to be away from the guiding groove. When the fastening element moves pivotally from the release position to the fastening position, the fastening element is guided to cause the fastening end of the fastening element to clasp with the fastening portion of the shelf. Furthermore, the fastening element is also guided to cause the pivot end of the fastening element to clasp with the fixing part of the frame rack when the fastening element moves pivotally from the release position to the fastening position.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, FIG. 1 is a partial perspective view of the rack according to an embodiment of the disclosure. The rack 5 is configured to host a server 6 and includes a frame rack 10 and a chassis 20. In this embodiment and some other embodiments, the rack 5 is a rack mounting server cabinet, but the disclosure is not limited thereto. The server 6 is hosted on the chassis 20. Thereby, the server 6 is configured to be disposed within the frame rack 10 through chassis 20 and thus the server is disposed within the rack 5. Also, the server 6 is configured to be removed from the chassis 20 by removing chassis 20 from the frame rack 10. Thereby, the change and the maintenance of the server 6 are able to be performed.

Figure 2:
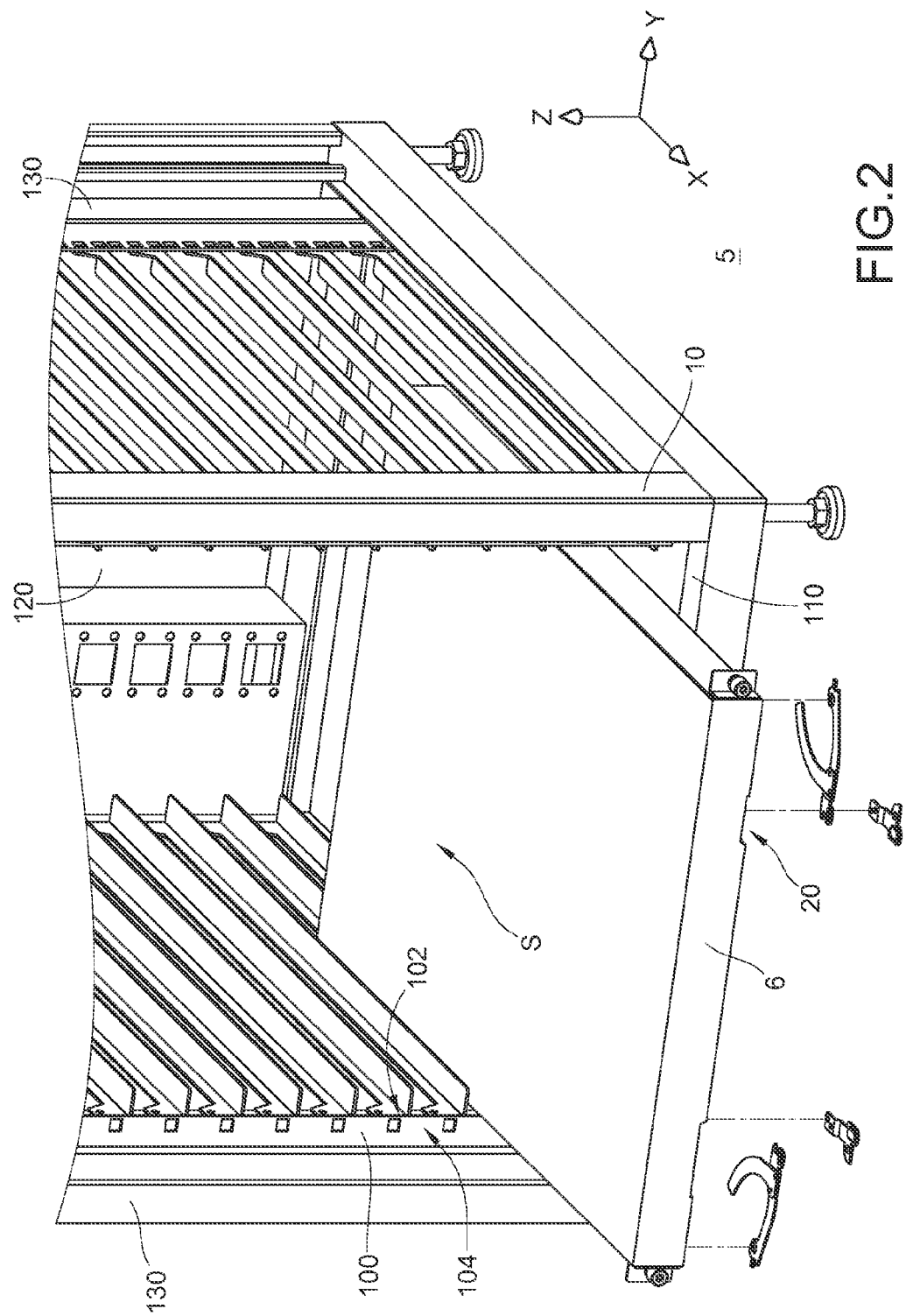
FIG. 2 is a partially exploded view of the rack of the disclosure in FIG. 1.
Figure 3:
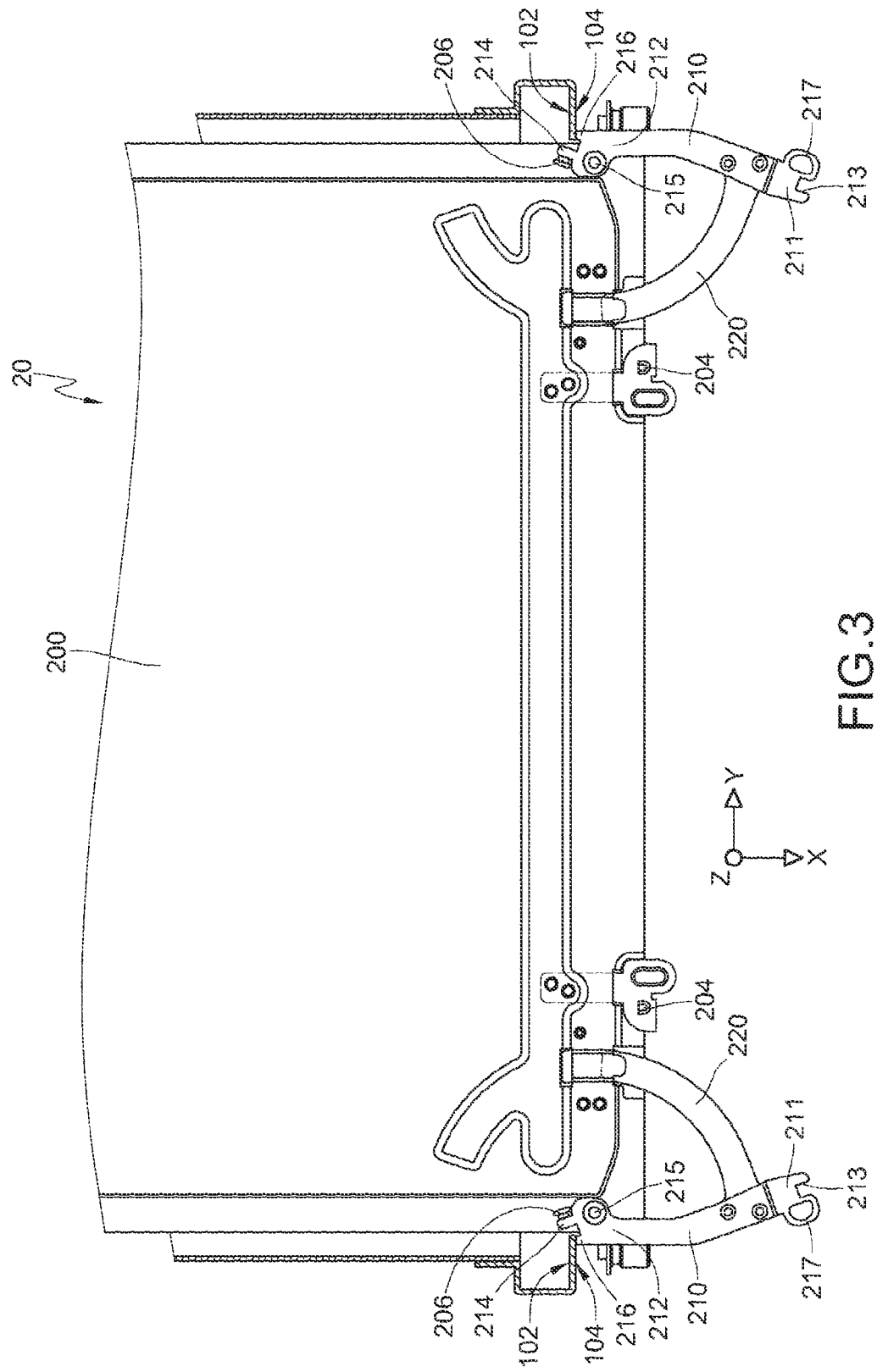
FIG. 3 is a top view of the frame rack and the chassis of the disclosure in FIG. 1.
Figure 4:
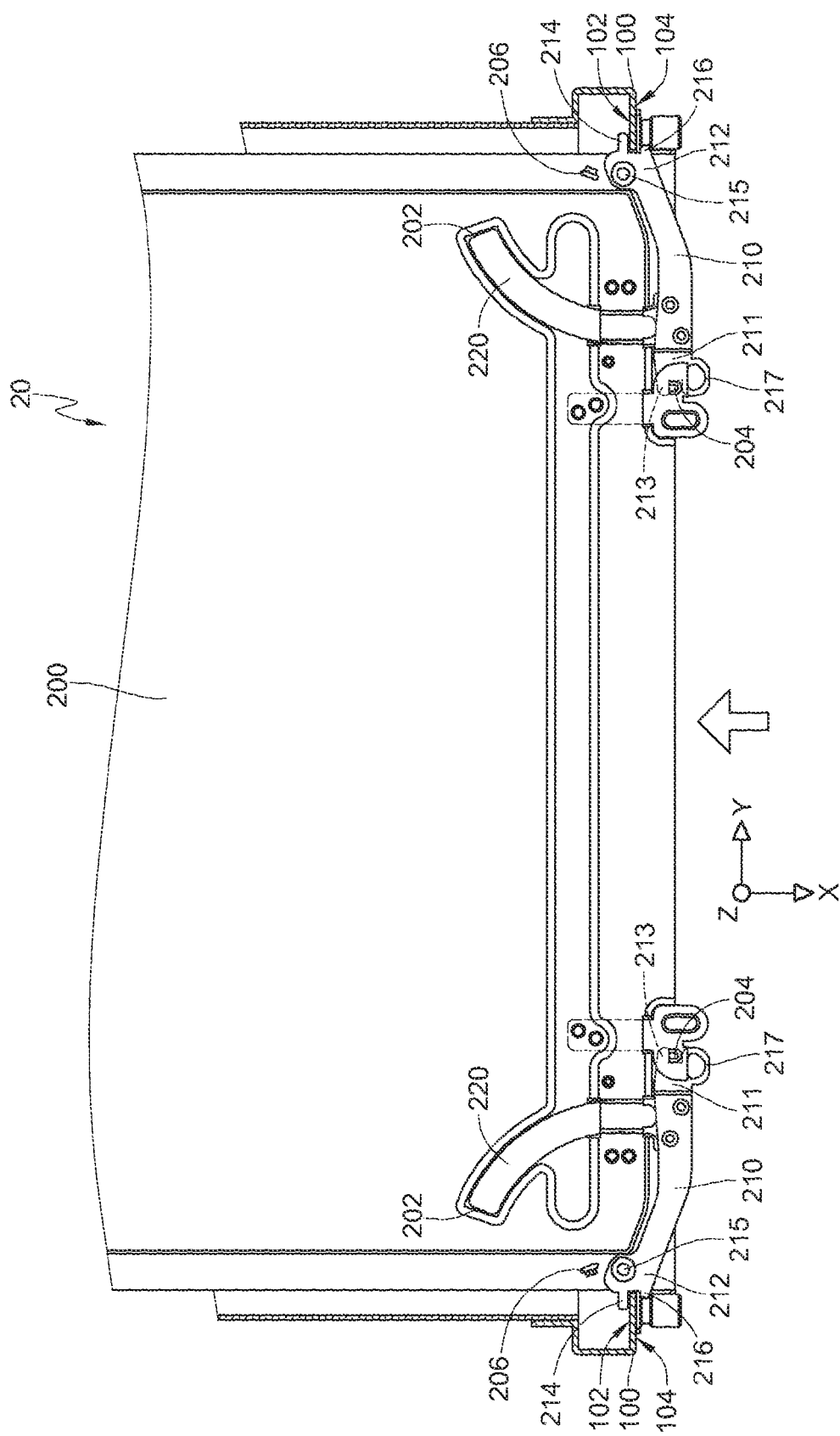
FIG. 4 is another top view of the frame rack and the chassis of the disclosure in FIG. 1.

With reference to FIG. 2 to FIG. 4, FIG. 2 is a partially exploded view of the rack of the disclosure in FIG. 1, FIG. 3 is a top view of the frame rack and the chassis of the disclosure in FIG. 1, and FIG. 4 is another top view of the frame rack and the chassis of the disclosure in FIG. 1. The frame rack 10 comprises a base 110, a rear wall 120 and two side walls 130. Two side walls 130 and the rear wall 120 stand perpendicularly on the base 110 with two side wall 130 connected to opposite edge of the rear wall 120 separately, together to form a space S. The frame rack 10 has a fixing part 100 attached to a side wall 130. The fixing part 100 has a first surface 102 and a second surface 104 opposite to each other. The first surface 102 faces the rear wall 120.

The chassis 20, located inside the space S, has a shelf 200, two fastening elements 210 and two guide members 220. The shelf 200 is disposed detachably on the frame rack 10 to serve as a mean for the server 6 to be slid in or removed from the rack 5.

The shelf includes a guiding groove 202 and a first fastening portion 204. The guiding groove 202 is a groove formed upward from the bottom surface of the shelf 200. Additionally, the guiding groove 202 matches the configuration of the guide member 220.

The fastening element 210 has a fastening end 211 and a pivot end 212. The pivot end 212 is fastened to the shelf 200 allowing the fastening element 210 to move pivotally accordingly. The fastening element 210 is made of, but not limited to, aluminum metal for its light weight and sufficient load-bearing capacity (namely, capacity for supporting the weight loaded upon).

When the fastening element 210 pivotally rotates around the pivot end 212, the fastening end 211 is configured to move pivotally away from or to clasp with the first fastening portion 204. The position where the fastening end 211 moves pivotally away from the first fastening portion 204 is defined as a release position. The position where the fastening end 211 clasps the first fastening portion 204 is defined as fastening position.

Specifically, the fastening element 210 comprises a second fastening portion 213, a clasp portion 214, a pivot 215 and a stop end 216. The second fastening portion 213 is located at the fastening end 211. The clasp portion 214 is located at the pivot end 212. The pivot 215 is located at pivot end 212. In addition, the pivot 215 is located in between the clasp portion 214 and the fastening end 211. The stop end 216 and the clasp portion 214 is located at the same side as the fastening element 210 and kept apart from each other at a distance. Moreover, the fastening element 210 is pivotally connected to the shelf 200 through the pivot 215 located at the pivot end 212.

The guide member 220 is disposed slideably on the guiding groove 202 and matches to the configuration of the guiding groove 202.

The guide member 220 is connected to the midsection of the fastening element 210 between the fastening end 211 and the pivot end 212. The setting of the guide member 220 is to draw the second fastening portion 213 of the fastening element 210 to clasp with the first fastening portion 204 of the self 200 accurately and fast, and to reduce the time to unload the shelf 200 from or load the shelf 200 to the rack 5. Moreover, by the setting of the guide member 220, the load-bearing capacity of the fastening element 210 is enhanced and deformation of the fastening element 210 is avoided. In other words, when the fastening element 210 receives a stress in the Z axis (vertical direction), which occurs when the shelf 200 is unloaded, the fastening element 210 may be deformed thereby and, to some extent, the significant deformation causes the second fastening portion 213 of the fastening element 210 deviated off the precise track to hook up with the first fastening portion 204 of the shelf 200. Such condition forces the users to experience inconvenience and to spend additional effort on adjusting and putting the second fastening portion 213 to the first fastening portion 204. In view of the situation described above, having the guide member 220 installed on the fastening element 210 is configured to strengthen the stress-bearing capacity of the fastening element 210 in the Z axis, so as to avoid the deformation of the fastening element 210 as well as the significant deviation of the alignment between the second fastening portion 213 of the fastening element 210 and the first fastening portion 204 of the shelf 200. In addition, in this embodiment and some other embodiments, the material of guide member 220 is aluminum metal, same as that of the fastening element 210, for its light weight and sufficient load-bearing capacity (namely, capacity for supporting weight loaded upon). Surface process may be applied to both the guide member 220 and the fastening element 210 to obtain same appearance.

In this embodiment and some other embodiments, the shelf 200 further includes a limiting block 206 near the clasp portion 214. The limiting block 206 is configured to serve as an angle block to the fastening element 210. When the fastening element 210 rotates from the fastening position to the release position, the limiting block 206 prevents the fastening element 210 from reaching an undesired point and causing the guide member 220 to completely withdraw from the guiding groove 202. Such undesired condition can require users to spend additional effort to align and insert the guide member 220 to the guiding groove 202, in order to draw the fastening element 210 return from the release position back to the fastening position.

Furthermore, in this embodiment and some other embodiments, the fastening element 210 also includes a finger ring 217. The finger ring 217 is located in the fastening end 211, and configured for handling the fastening element 210. The finger 217 has a shape of ring for user to grip by the finger and to pull the fastening element 210 to its release position.

The following paragraphs further explain how to store a server in the rack, or to unload the server from the rack, with the illustration in FIG. 1, FIG. 3 and FIG. 4.

The method to store a server 6 in the frame rack 10, or to unload the server 6 from the rack 5, is to turn the fastening element 210 from the fastening position to the release position in order to remove the chassis 20 from the rack 5 (as shown in FIG. 3). The first step is to grip the finger ring 217 and pull the fastening element 210 off to its release position. When the fastening element 210 moves pivotally, the fastening element 210 also draws the guide member 220 out from the guiding groove 202. When the fastening element 210 moves pivotally, the stop end 216 rests against the second surface 104 of the fixing part 100, so that the shelf 200 is drawn from the frame rack 10. The final step completes when the clasp portion 214 leans against the limiting block 206, and the fastening element 210 is located at the release position.

To store a server in the rack, the fastening element 210 shall be turned pivotally from the release position to the fastening position (as illustrated in FIG. 4). The first step is to align the guide member 220 with the guiding groove 202, then to push the fastening element 210. The fastening element 210 is led by the guide member 220 so as to cause the fastening end 211 of the fastening element 210 to clasp with the first fastening portion 204 of the shelf 200, and the pivot end 212 of the fastening element 210 to clasp with the fixing part 100 of the frame rack 10. Specifically, the second fastening portion 213 at the fastening end 211 clasps with the first fastening portion 204 while the clasp portion 214 at the pivot end 212 rests against the first surface 102 of the fixing part 100 and the stop end 216 against the second surface 104 thereof. Hence, the fastening element 210 returns to the fastening position and the server is inserted into the rack thereby.

The rack in the above-mentioned embodiments of the disclosure offers a solution to efficiently insert or withdraw the chassis to and from the rack respectively. The shelf has a guiding groove matching the configuration of the guide member. Thereby, the guide member connected to the midsection of the fastening element is allowed to slide in and out. The setting of combining the guiding groove and guide member directs the second fastening portion of the fastening element to clasp with the first fastening portion of the shelf fast and precisely. Moreover, the rack in the above-mentioned embodiments of the disclosure shortens the time needed to load or remove the chassis.

In addition, in this embodiment and some other embodiments, the guide member is connected to the fastening element. Thereby, the resistance to deformation of the fastening element in terms of the load-bearing capacity is increased and the significant deviation of the alignment between the second fastening portion and the first fastening portion caused by the deformation is avoided.

What is claimed is:

1. A rack configured for hosting a server, comprising:
a frame rack having a fixing part; and
a chassis comprising:
a shelf disposed detachably on the frame rack, the shelf hosting the server and having a guiding groove as well as a first fastening portion;
a fastening element having a fastening end and a pivot end, the pivot end being pivotally connected to the shelf allowing the fastening end to turn pivotally away from the first fastening portion or to clasp with the first fastening portion at a release position or fastening position respectively, the fastening element comprising a finger ring located in the fastening end and configured for handling the fastening element; and
a guide member configured to slide in the guiding groove, one end of the guide member being connected to the midsection of the fastening element;
wherein the guide member is driven by the fastening element to be away from the guiding groove when the fastening element moves pivotally from the fastening position to the release position, and guides the fastening element to cause the fastening end of the fastening element to clasp with the first fastening portion of the shelf and the pivot end of the fastening element to clasp with the fixing part of the frame rack when the fastening element moves pivotally from the release position to the fastening position.

2. The rack according to claim 1, wherein the frame rack comprises a base, a rear wall and two side walls, two side walls as well as the rear wall standing perpendicularly on the base, the two side walls are connected to opposite edge of the rear wall separately and thereby together form a space, and the chassis stored in the space.

3. The rack according to claim 2, wherein the fixing part is located on one of the two side walls and has a first surface and a second surface opposite to each other, the first surface faces the rear wall, the fastening element has a clasp portion at the pivot end, and the clasp portion leans against and clasps the first surface of the fixing part when the fastening element is at the fastening position.

4. The rack according to claim 3, wherein the fastening element includes a pivot, the pivot is at the pivot end and the pivot is located in between the clasp portion and the fastening end.

5. The rack according to claim 3, wherein the fastening element comprises a second fastening portion at the fastening end, the second fastening portion clasps with the first fastening portion, so as to keep the fastening element fixing at the fastening position when the fastening element is at the fastening position.

6. The rack according to claim 3, wherein the fastening element further comprises a stop end, the stop end is at the same end of the fastening element as the clasp portion and separated from the clasp portion at a distance, the clasp portion and the stop end face the first surface and the second surface of the fixing part respectively when the fastening element is at the fastening position, and when the fastening element turns pivotally from the fastening position to the release position, the stop end rests against the second surface of the fixing part, so as to pull the shelf out from the frame rack.

7. The rack according to claim 3, wherein the shelf further comprises a limiting block near the clasp portion, and the clasp portion stops at the limiting block when the fastening element stations at the release position.

* * * * *